United States Patent
Lee et al.

(10) Patent No.: US 11,488,952 B2
(45) Date of Patent: Nov. 1, 2022

(54) SEMICONDUCTOR DEVICE INCLUDING SELF-ALIGNED CONTACT AND METHOD OF MANUFACTURING THE SEMICONDUCTOR DEVICE

(71) Applicant: SAMSUNG ELECTRONICS CO., LTD., Suwon-si (KR)

(72) Inventors: Sanghyun Lee, Hwaseong-si (KR);
Sungwoo Kang, Suwon-si (KR);
Jongchul Park, Seoul (KR);
Youngmook Oh, Hwaseong-si (KR);
Jeongyun Lee, Yongin-si (KR)

(73) Assignee: SAMSUNG ELECTRONICS CO., LTD.

( * ) Notice: Subject to any disclaimer, the term of this patent is extended or adjusted under 35 U.S.C. 154(b) by 224 days.

(21) Appl. No.: 16/888,209

(22) Filed: May 29, 2020

(65) Prior Publication Data
US 2021/0217749 A1   Jul. 15, 2021

(30) Foreign Application Priority Data
Jan. 10, 2020 (KR) .......................... 10-2020-0003668

(51) Int. Cl.
*H01L 21/768* (2006.01)
*H01L 29/06* (2006.01)
*H01L 27/088* (2006.01)
*H01L 29/417* (2006.01)

(52) U.S. Cl.
CPC .... *H01L 27/0886* (2013.01); *H01L 21/76897* (2013.01); *H01L 29/41791* (2013.01)

(58) Field of Classification Search
CPC ......... H01L 27/11556; H01L 27/11582; H01L 21/76802
See application file for complete search history.

(56) References Cited

U.S. PATENT DOCUMENTS

| | | | |
|---|---|---|---|
| 7,875,551 B2 | 1/2011 | Lee et al. | |
| 8,053,358 B2 | 11/2011 | Lee et al. | |
| 9,076,816 B2 | 7/2015 | Zhang et al. | |
| 9,406,679 B2 | 8/2016 | Edge et al. | |
| 9,941,161 B2 * | 4/2018 | Liao | H01L 29/785 |
| 10,121,702 B1 | 11/2018 | Park et al. | |
| 10,211,103 B1 | 2/2019 | Huang et al. | |
| 10,332,963 B1 | 6/2019 | Xie | |
| 10,373,912 B2 | 8/2019 | Lee et al. | |

(Continued)

*Primary Examiner* — Fernando L Toledo
*Assistant Examiner* — Valerie N Newton
(74) *Attorney, Agent, or Firm* — Myers Bigel, P.A.

(57) ABSTRACT

A semiconductor device according to some embodiments of the disclosure may include a fin type active pattern extending in a first direction, a plurality of gate structures on the fin type active pattern and extending in a second direction different from the first direction, a plurality of inter-contact insulation patterns on respective ones of the plurality of gate structures, a plurality of interlayer insulation layers on side surfaces of the plurality of gate structures, and a plurality of contact plugs respectively between pairs of the plurality of gate structures. The fin type active pattern may include a plurality of source/drains. Lower ends of the plurality of contact plugs may contact the plurality of source/drains. The plurality of gate structures may each include a first gate metal, a second gate metal, a gate capping layer, a gate insulation layer, a first spacer, and a second spacer.

20 Claims, 15 Drawing Sheets

(56) References Cited

U.S. PATENT DOCUMENTS

2018/0083002 A1\* 3/2018 Kim ................... H01L 21/768
2019/0214343 A1   7/2019 Lee et al.
2020/0091345 A1\* 3/2020 Chiu .................. H01L 29/7851

\* cited by examiner

SEMICONDUCTOR DEVICE INCLUDING SELF-ALIGNED CONTACT AND METHOD OF MANUFACTURING THE SEMICONDUCTOR DEVICE

CROSS-REFERENCE TO THE RELATED APPLICATION

This application claims priority from Korean Patent Application No. 10-2020-0003668, filed on Jan. 10, 2020, in the Korean Intellectual Property Office, the disclosure of which is incorporated herein by reference in its entirety.

BACKGROUND

1. Field

The inventive concept relates to a semiconductor device including a self-aligned contact (SAC) for securing a bottom open margin of a contact plug without the shoulder-loss of a gate structure and a method of manufacturing the semiconductor device.

2. Description of the Related Art

As semiconductor devices become more highly integrated, a margin of a contact hole is largely reduced. In a method of manufacturing a semiconductor device, since a space between wirings may be insufficient, a process of forming a contact plug may use a self-aligned contact (SAC) process to overcome misalignment occurring in a mask process. When manufacturing a semiconductor device using a SAC process of the related art, the shoulder-loss of a gate structure and a bottom open margin of the contact plug may have a trade-off relationship therebetween. That is, in an etching process which selects a high selectivity, a problem may occur in a bottom open margin of the contact plug, and in an etching process which lowers a selectivity, a shoulder of silicon nitride of the gate structure may collapse when performing a subsequent process. Therefore, it is desired to develop a semiconductor device and a method of manufacturing the semiconductor device, for preventing the shoulder-loss of the gate structure and securing a suitable bottom open margin of the contact plug.

SUMMARY

The example embodiments of the disclosure provide a method of manufacturing a semiconductor device, which includes a process of forming a double sacrificial layer structure, thereby performing a high selectivity process, securing a bottom open margin of a source/drain contact plug of the manufactured semiconductor device, and preventing the collapse of a shoulder of silicon nitride of a gate structure of the manufactured semiconductor device.

The example embodiments of the disclosure provide a method of manufacturing a semiconductor device, in which the semiconductor device is manufactured by performing a process including a process of forming a double sacrificial layer, and thus, the semiconductor device including a self-aligned contact includes a gate structure including a concavely recessed top surface and an inter-contact insulation pattern including a lowermost surface disposed at a level which is lower than an uppermost surface of the gate structure.

A semiconductor device in accordance with some embodiments of the disclosure may include a fin type active pattern that extends in a first direction, a plurality of gate structures on the fin type active pattern and extending in a second direction different from the first direction, a plurality of inter-contact insulation patterns on respective ones of the plurality of gate structures, a plurality of interlayer insulation layers on side surfaces of the plurality of gate structures, and a plurality of contact plugs respectively between pairs of the plurality of gate structures. The fin type active pattern may include a plurality of source/drains. Lower ends of the plurality of contact plugs may contact respective ones of the plurality of source/drains. The plurality of gate structures may each include a first gate metal, a second gate metal on a side surface and a lower portion of the first gate metal, a gate capping layer on the first gate metal and the second gate metal, the gate capping layer including a side surface which is inclined so that an area of a horizontal cross-sectional surface thereof increases toward an upper portion thereof in a direction away from the fin type active pattern, a gate insulation layer on a side surface and a lower portion of the second gate metal and a lower portion of a side surface of the gate capping layer, a first spacer on a side surface of the gate insulation layer and a side surface of the gate capping layer, and a second spacer on a side surface of the first spacer. An uppermost surface of the gate capping layer, an uppermost surface of the first spacer, and an uppermost surface of the second spacer may be at a level which is higher than a lowermost surface of each of the plurality of inter-contact insulation patterns, with respect to the fin type active patterns. A top surface of the gate capping layer may be concavely recessed. A top surface of the first spacer may be downward recessed towards the fin type active pattern.

A semiconductor device in accordance with some embodiments of the disclosure may include a fin type active pattern that extends in a first direction, a plurality of gate structures on the fin type active pattern and extending in a second direction different from the first direction, a plurality of inter-contact insulation patterns on respective ones of the plurality of gate structures, a plurality of interlayer insulation layers on side surfaces of the plurality of gate structures, and a plurality of contact plugs respectively between pairs of the plurality of gate structures. The fin type active pattern may include a plurality of source/drains. Lower ends of the plurality of contact plugs may contact respective ones of the plurality of source/drains. The plurality of gate structures may each include a first gate metal, a second gate metal on a side surface and a lower portion of the first gate metal, a gate capping layer on the first gate metal and the second gate metal, a gate insulation layer on a side surface and a lower portion of the second gate metal and a lower portion of a side surface of the gate capping layer, a first spacer on a side surface of the gate insulation layer and the gate capping layer, and a second spacer on a side surface of the first spacer. An uppermost surface of the gate capping layer, an uppermost surface of the first spacer, and an uppermost surface of the second spacer may be at a level which is higher than a lowermost surface of each of the plurality of inter-contact insulation patterns, with respect to the fin type active pattern. A top surface of the gate capping layer may be concavely recessed. A top surface of the first spacer may be downward recessed towards the fin type active pattern.

A semiconductor device in accordance with some embodiments of the disclosure may include a fin type active pattern extending in a first direction, a plurality of gate structures on the fin type active pattern and extending in a second direction different from the first direction, a plurality of inter-contact insulation patterns on respective ones of the plurality of gate structures, a plurality of interlayer insulation layers on side surfaces of the plurality of gate structures, and a plurality of contact plugs between pairs of the plurality of gate structures. The fin type active pattern may include a plurality of source/drains. Lower ends of the plurality of contact plugs may contact respective ones of the plurality of source/drains. The plurality of gate structures may each include a first gate metal, a second gate metal on a side surface and a lower portion of the first gate metal, a gate capping layer disposed on the first gate metal and the second gate metal, a gate insulation layer on a side surface and a lower portion of the second gate metal and a lower portion of a side surface of the gate capping layer, a first spacer on a side surface of each of the gate insulation layer and the gate capping layer, a second spacer on a side surface of the first spacer, and a plurality of gate layers sequentially stacked apart from one another on a lower portion of the gate insulation layer. An uppermost surface of the gate capping layer, an uppermost surface of the first spacer, and an uppermost surface of the second spacer may be at a level which is higher than a lowermost surface of each of the plurality of inter-contact insulation patterns, with respect to the fin type active pattern. A top surface of the gate capping layer may be concavely recessed. A top surface of the first spacer may be downward recessed towards the fin type active pattern.

A method of manufacturing a semiconductor device in accordance with some embodiments of the disclosure may include forming a plurality of gate structures, each including a first gate metal, a second gate metal, a gate insulation layer, a first spacer, a second spacer, and a gate capping layer, forming a first sacrificial layer covering the plurality of gate structures, forming a first etch stop layer on the first sacrificial layer, forming a second sacrificial layer on the first etch stop layer, forming a second etch stop layer on the second sacrificial layer, patterning the second sacrificial layer and the second etch stop layer to form a plurality of first openings exposing the first etch stop layer, forming a first deposition layer filing the plurality of first openings and overlapping the second sacrificial layer and the second etch stop layer, removing a portion of the second sacrificial layer, a whole portion of the second etch stop layer, a portion of the first deposition layer, removing the second sacrificial layer to form a plurality of second openings, exposing the first etch stop layer, between adjacent first deposition layers, removing the first etch stop layer exposed at inner portions of the plurality of second openings to expose the first sacrificial layer at the inner portions of the plurality of second openings, removing the first sacrificial layer exposed at the inner portions of the plurality of second openings to expose the plurality of gate structures at the inner portions of the plurality of second openings, forming a second deposition layer filling the plurality of second openings and covering the first deposition layer, removing a portion of the second deposition layer, a whole portion of the first deposition layer, and a whole portion of the first etch stop layer, removing the first sacrificial layer and forming a contact plug material layer, and partially removing an upper portion of the contact plug material layer and an upper portion of the second deposition layer to form a plurality of contact plugs.

DETAILED DESCRIPTION

Figure 1:
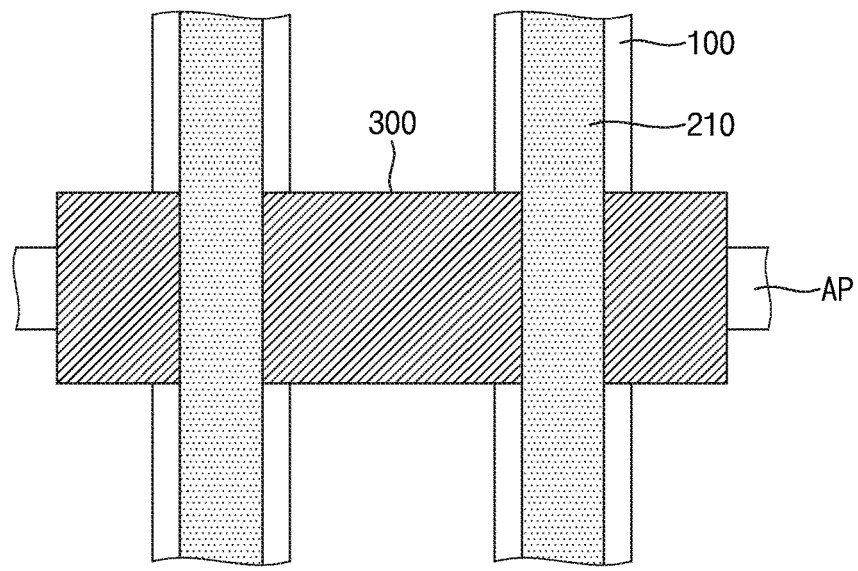
FIG. 1 is a diagram illustrating an example of a semiconductor device according to some embodiments of the disclosure as seen in a top view.
Figure 2A:
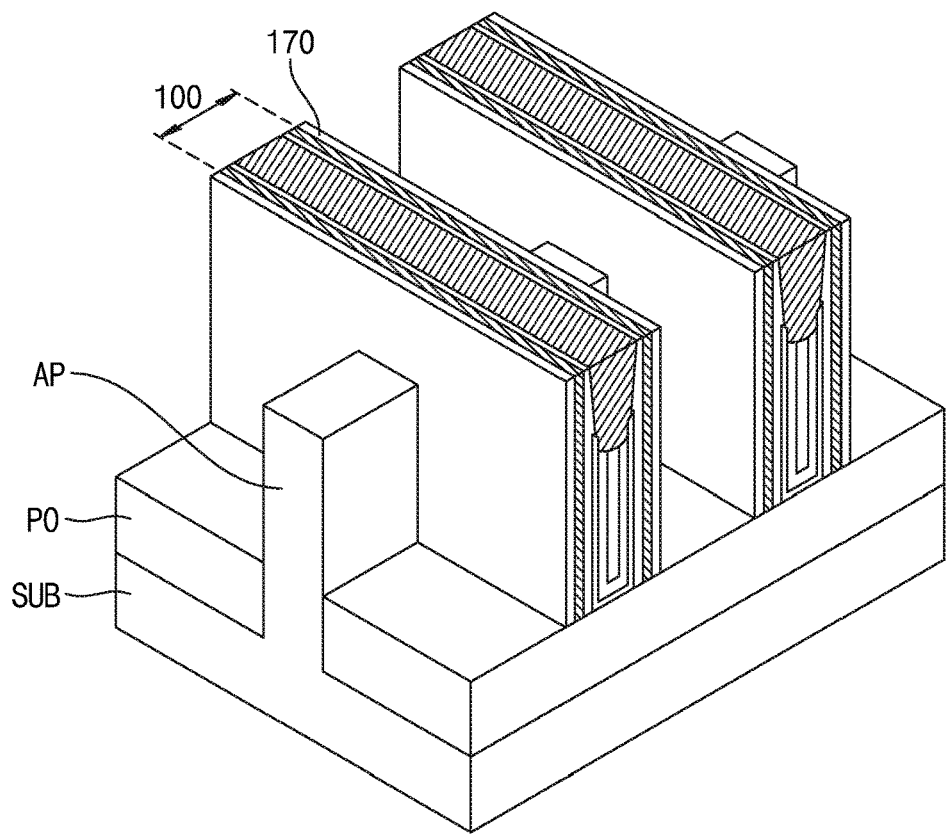
FIGS. 2A and 2B are diagrams illustrating a three-dimensional (3D) shape of a semiconductor device according to various embodiments.
Figure 2B:
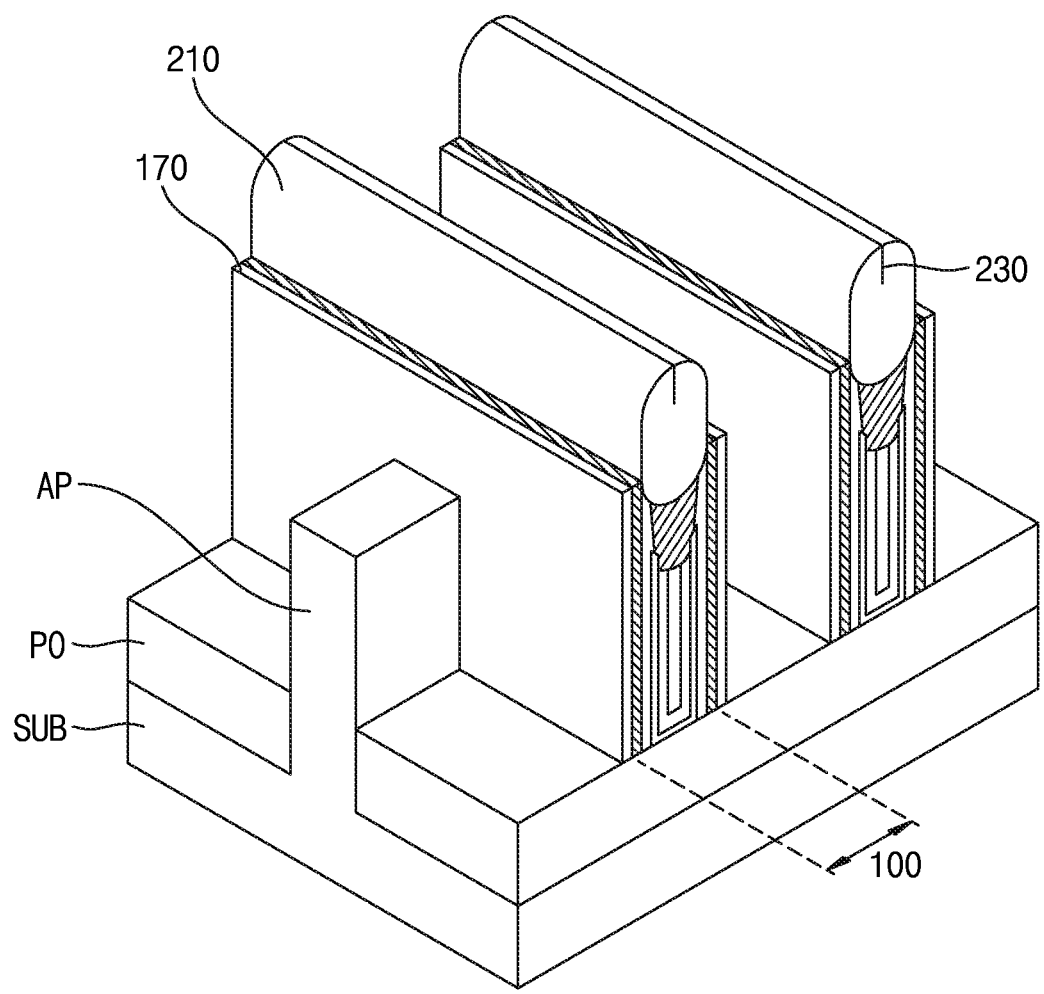

FIG. 1 is a diagram illustrating an example of a semiconductor device 1 according to some embodiments of the disclosure as seen in a top view, and FIGS. 2A and 2B are diagrams illustrating a three-dimensional (3D) shape of a semiconductor device 1 according to various embodiments. Referring to FIGS. 1, 2A, and 2B, the semiconductor device 1 according to some embodiments of the disclosure may include a fin type active pattern AP extending in a first direction and on a substrate SUB, a plurality of gate structures 100 extending in a second direction differing from the first direction on the fin type active pattern AP, a plurality of inter-contact insulation patterns 210 disposed on the gate structures 100, and a plurality of interlayer insulation layers 170 disposed on side surfaces of the gate structures 100, and a plurality of contact plugs 300 disposed between the gate structures 100. The semiconductor device may further include an insulating oxide layer PO disposed on the substrate SUB. The insulating oxide layer PO may overlap some surfaces of the substrate SUB. The first direction may be substantially perpendicular to the second direction.

FIGS. 3A, 3B, and 4 to 9 are diagrams illustrating side cross-sectional surfaces of a semiconductor device 1 according to various embodiments.

Figure 3A:
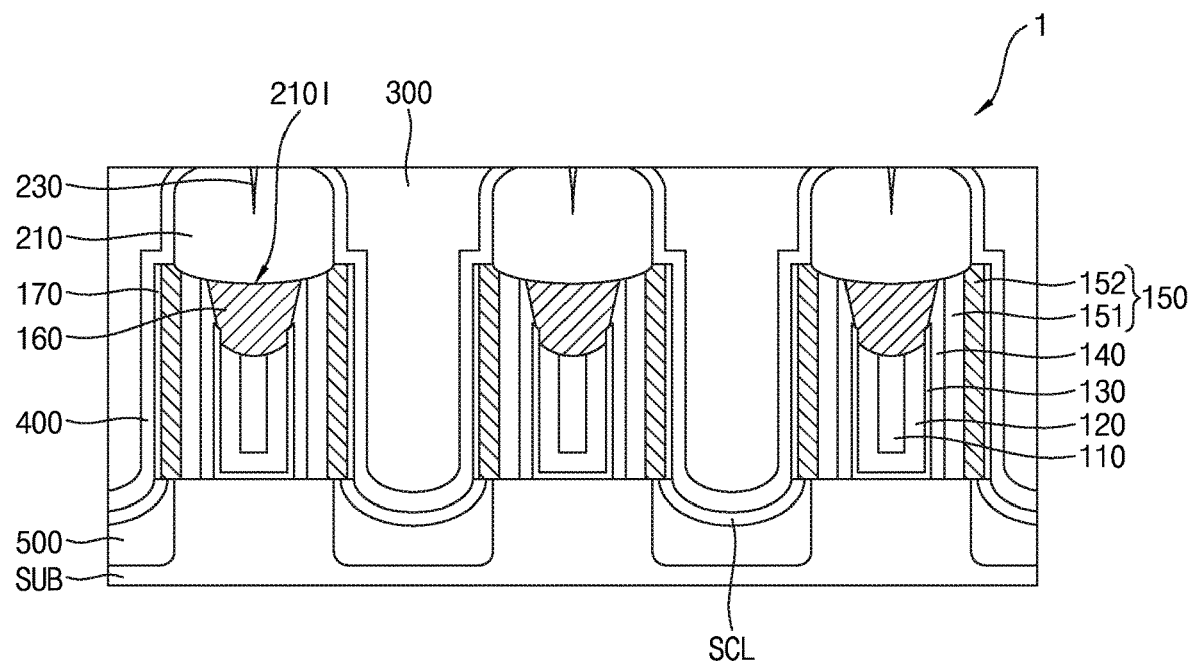
FIGS. 3A, 3B, and 4 to 9 are diagrams illustrating side cross-sectional surfaces of a semiconductor device according to various embodiments.

Referring to FIG. 3A, the semiconductor device 1 according to some embodiments of the disclosure may include a first gate metal 110, a second gate metal 120, a gate insulation layer 130, a first spacer 140, a second spacer 150, a gate capping layer 160, a plurality of contact plugs 300, and an inter-contact insulation pattern 210.

The first gate metal 110 and the second gate metal 120 may include tungsten (W), copper (Cu), aluminum (Al), or other metal. The second gate metal 120 may surround a side surface and a lower portion of the first gate metal 110. The gate capping layer 160 may be disposed on the first gate metal 110 and the second gate metal 120. The gate capping layer 160 may include silicon nitride such as SiN or SiCN. The gate capping layer 160 may not include oxide, thus preventing shifting of a gate voltage Vt of each of the first gate metal 110 and the second gate metal 120. In some embodiments, a side surface of the gate capping layer 160 may be inclined so that an area of a horizontal cross-sectional surface thereof increases toward an upper portion thereof, with respect to the substrate SUB.

Referring to FIG. 3A, the gate insulation layer 130 may surround a side surface and a lower portion of the second gate metal 120 and a lower portion of a side surface of the gate capping layer 160. The gate insulation layer 130 may include a high-K material such as $HfO_2$. A side top surface of the gate insulation layer 130 may be inclined to have a positive (+) slope in a direction from an inner portion thereof to an outer portion thereof in a direction away from the substrate SUB. An uppermost surface of the gate insulation layer 130 may be disposed at a level which is higher than an uppermost surface of each of the first and second gate metals 110 and 120, with respect to the substrate SUB.

The first spacer 140 may be disposed on a side surface of the gate insulation layer 130 and an upper side surface of the gate capping layer 160. The first spacer 140 may include a low-K material. For example, the first spacer 140 may include SiOCN, SiN, SiON, or SiCN.

The second spacer 150 may be disposed on a side surface of the first spacer 140. The second spacer 150 may include SiN, SiON, SiCN, or SiOCN. The second spacer 150 may include an internal second spacer 151 and an external second spacer 152. That is, in some embodiments, the second spacer 150 may include two or more spacers. The internal second spacer 151 and the external second spacer 152 may include a low-K material.

The interlayer insulation layer 170 may be disposed on a side surface of each of the gate structures 100. That is, the interlayer insulation layer 170 may be disposed on a side surface of the second spacer 150 of each of the gate structures 100. The interlayer insulation layer 170 may be formed when an interlayer dielectrics (ILD) oxide layer between the gate structures 100 is not completely removed in a process of manufacturing the gate structures 100. The interlayer insulation layer 170 may include silicon oxide.

Referring to FIG. 3A, the inter-contact insulation pattern 210 may be disposed on the gate capping layer 160, the first spacer 140, and the second spacer 150. A top surface of the inter-contact insulation pattern 210 may be partially rounded. Referring to FIG. 3A, the inter-contact insulation pattern 210 and a center of the gate capping layer 160 may be vertically aligned. For example, the inter-contact insulation pattern 210 may vertically overlap the gate capping layer 160. The inter-contact insulation pattern 210 may include silicon oxide. A bottom surface of the inter-contact insulation pattern 210 may protrude downward toward the first and second gate metals 110 and 120. A top surface of the gate capping layer 160 may be concavely recessed. Accordingly, an uppermost surface of the gate capping layer 160 may be disposed at a level which is higher than a lowermost surface 210l of the inter-contact insulation pattern 210.

Referring to FIG. 3A, a top surface of the first spacer 140 may be downward recessed. An uppermost surface of the first spacer 140 may be disposed at a level which is higher than the lowermost surface 210l of the inter-contact insulation pattern 210. In some embodiments, a top surface of the second spacer 150 may be downward recessed. An uppermost surface of the second spacer 150 may be disposed at a level which is higher than the lowermost surface 210l of the inter-contact insulation pattern 210.

In the semiconductor device 1 manufactured by a method of manufacturing a semiconductor device according to some embodiments of the disclosure, a portion of an upper portion of at least one of the gate capping layer 160, the first spacer 140, and the second spacer 150 may be oxidized, and thus, the lowermost surface 210l of the inter-contact insulation pattern 210 may be disposed at a level which is lower than a top surface of at least one of the gate capping layer 160, the first spacer 140, and the second spacer 150. For example, the inter-contact insulation pattern 210 may include an upper portion including deposited silicon oxide and a lower portion including oxidized silicon nitride. The lower portion of the inter-contact insulation pattern 210 may be a silicon oxide layer including nitrogen.

The contact plugs 300 may be disposed between the gate structures 100. The contact plugs 300 may be formed by a self-aligned contact (SAC) process which uses the gate capping layer 160, the first spacer 140, the second spacer 150, and the interlayer insulation layer 170 of the gate structure 100 as a mask. A top surface of the inter-contact insulation pattern 210 and a top surface of the contact plug 300 may be coplanar. A lower end of the contact plug 300 may contact the fin type active pattern AP or a source/drain included in a substrate SUB. In some embodiments, the fin type active pattern AP may further include a silicide layer SCL disposed between the contact plug 300 and the source/drain 500.

Figure 3B:
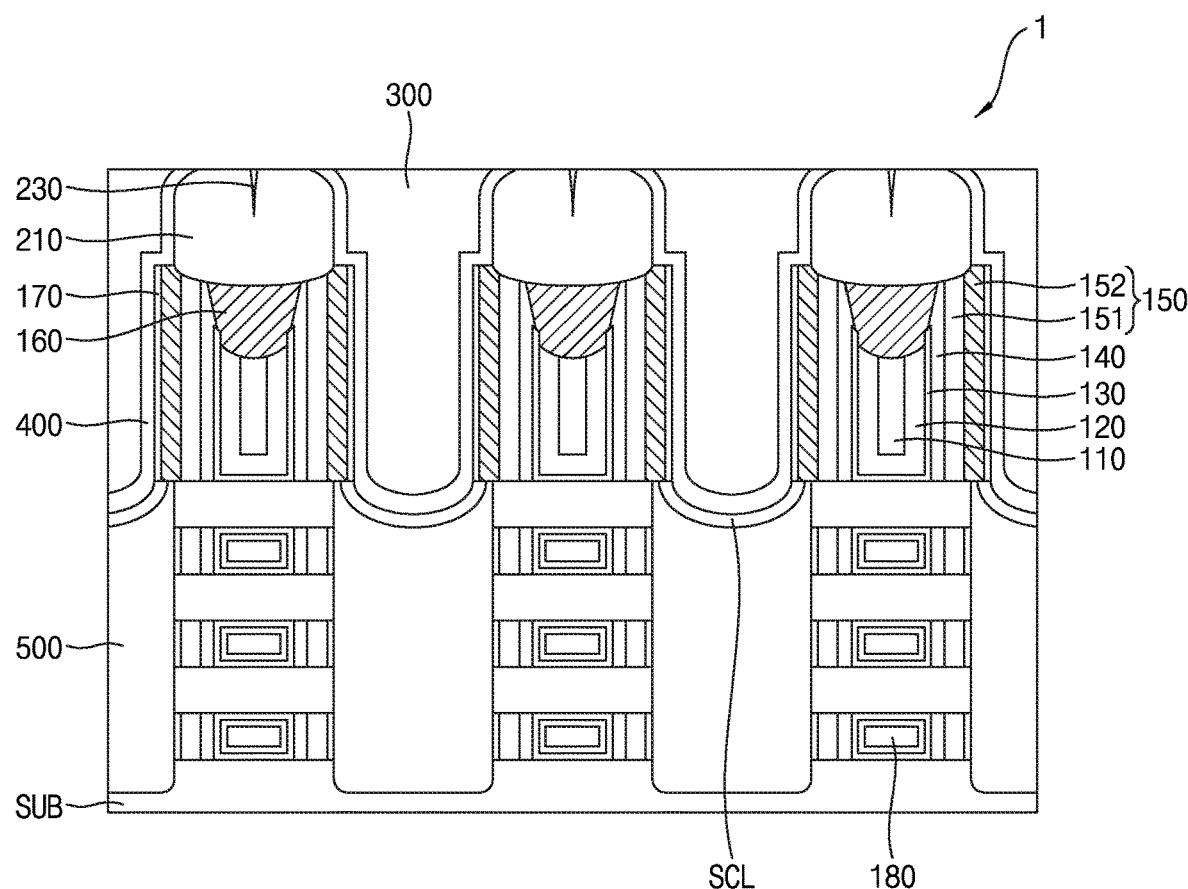

Referring to FIG. 3B, the gate structure 100 of the semiconductor device 1 may further include a plurality of gate layers 180 which are sequentially stacked apart from one another on a lower portion of the gate insulation layer 130. That is, the gate structure 100 of the semiconductor device 1 according to some embodiments of the disclosure may include a multi-bridged channel field effect transistor (MBCFET) structure including three nano-sheets.

Figure 4:
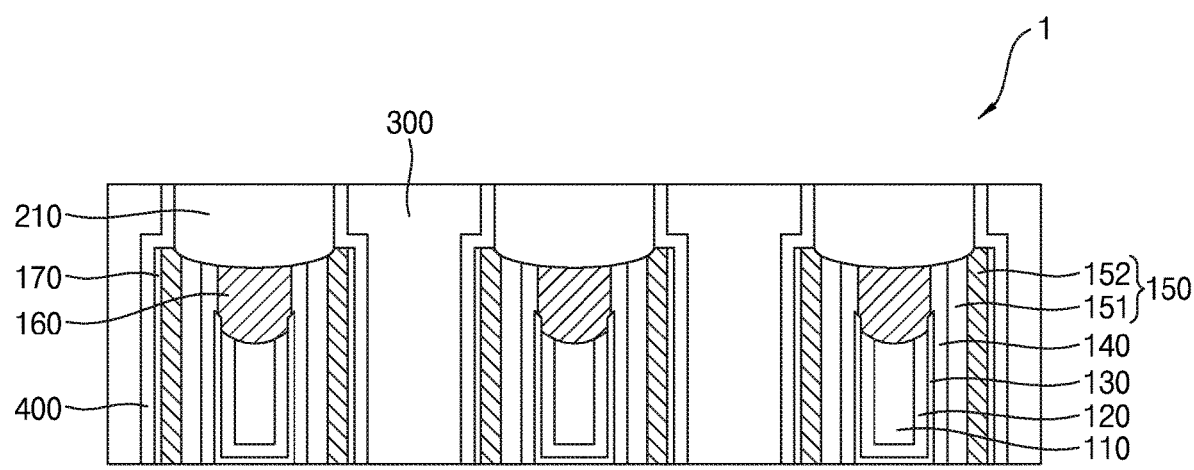
Figure 5:
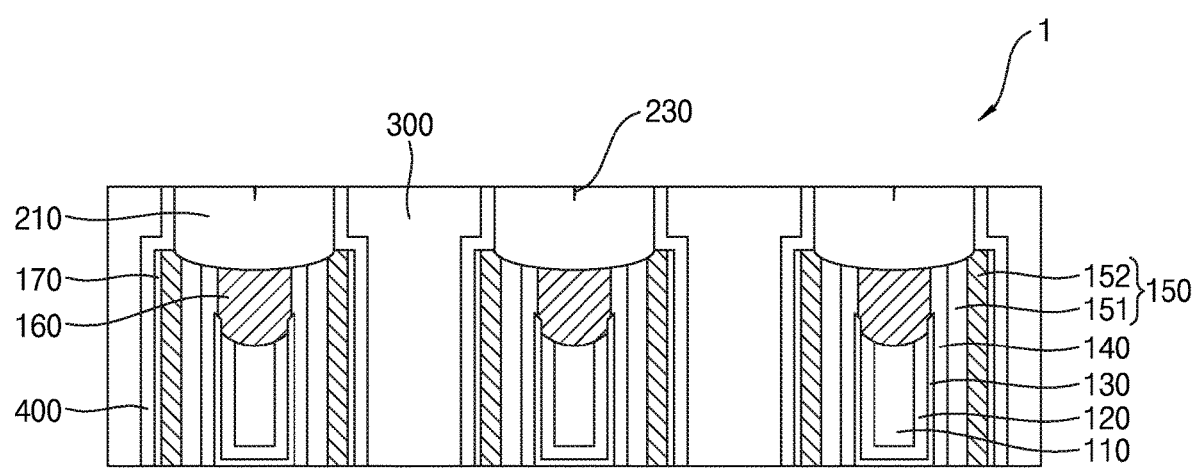

Referring to FIG. 3A, the semiconductor device 1 may further include a seam 230 disposed at the inter-contact insulation pattern 210. The seam 230 may be formed by an atomic layer distribution (ALD) process. The seam 230 may be formed vertically along a center axis of the inter-contact insulation pattern 210. Referring to FIG. 4, in a case where an upper portion of the contact plug 300 and an upper portion of the inter-contact insulation pattern 210 are sufficiently polished through a chemical mechanical polishing (CMP) process or where a depth of the seam 230 is low, the seam 230 may be omitted. Referring to FIG. 5, when a depth of the seam 230 is deep, a lower portion of the seam 230 may remain despite an excessively performed CMP process.

Referring to FIG. 5, in some embodiments, the gate insulation layer 130 may surround a side surface and a lower portion of the second gate metal 120 and a lower portion of a side surface of the gate capping layer 160. The first spacer 140 may be disposed on a side surface of each of the gate insulation layer 130 and the gate capping layer 160. The inter-contact insulation pattern 210 may be disposed on the gate capping layer 160, the first spacer 140, and the second spacer 150. An uppermost surface of the gate capping layer 160, an uppermost surface of the first spacer 140, and an uppermost surface of the second spacer 150 may be disposed at a level which is higher than the lowermost surface 210l of the inter-contact insulation pattern 210. In some embodiments, a top surface of at least one of the gate capping layer 160, the first spacer 140, and the second spacer 150 may be concavely recessed. Whether to recess a top surface of each of the gate capping layer 160, the first spacer 140, and the second spacer 150 may be determined based on a material of each of the gate capping layer 160, the first spacer 140, and the second spacer 150 and a position of the inter-contact insulation pattern 210.

Figure 6:
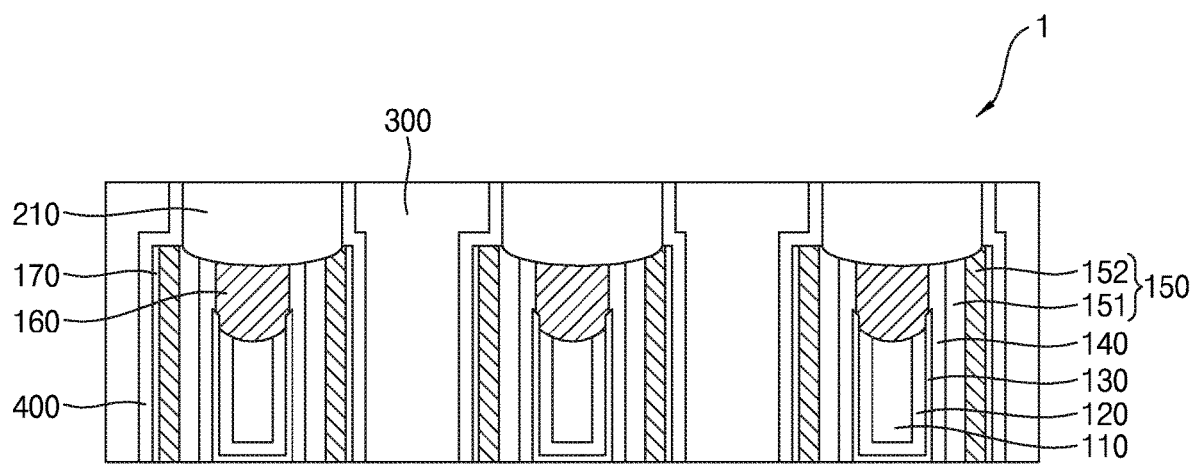
Figure 7:
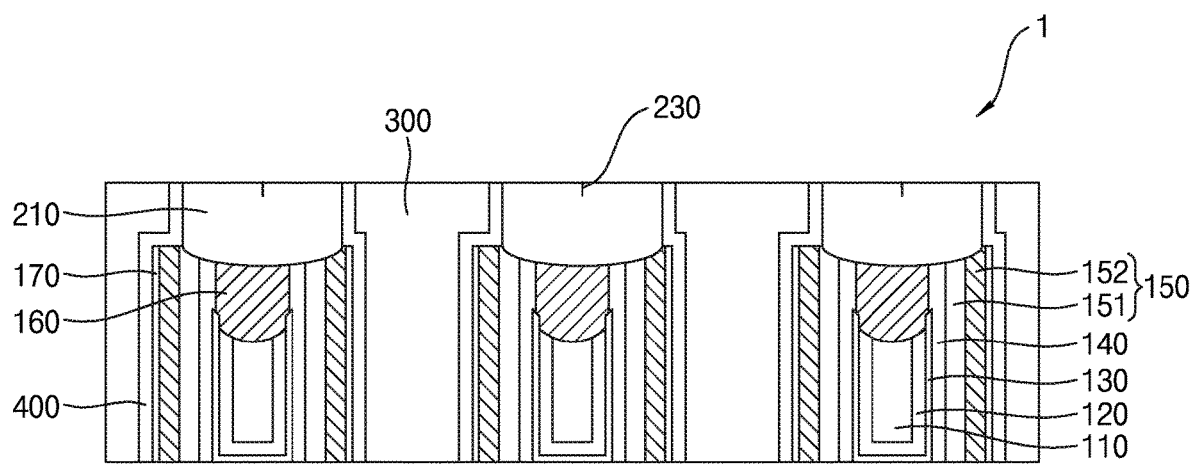
Figure 8:
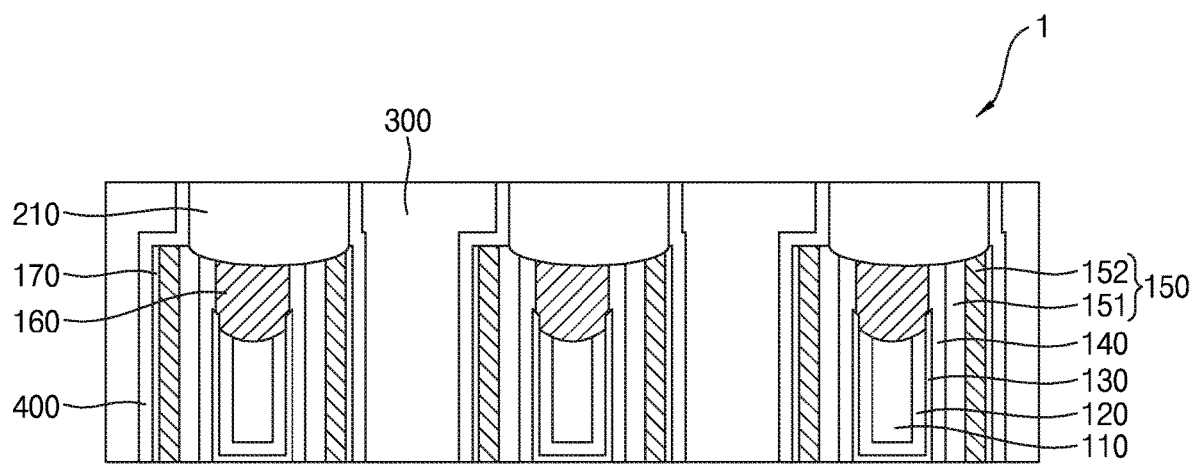
Figure 9:
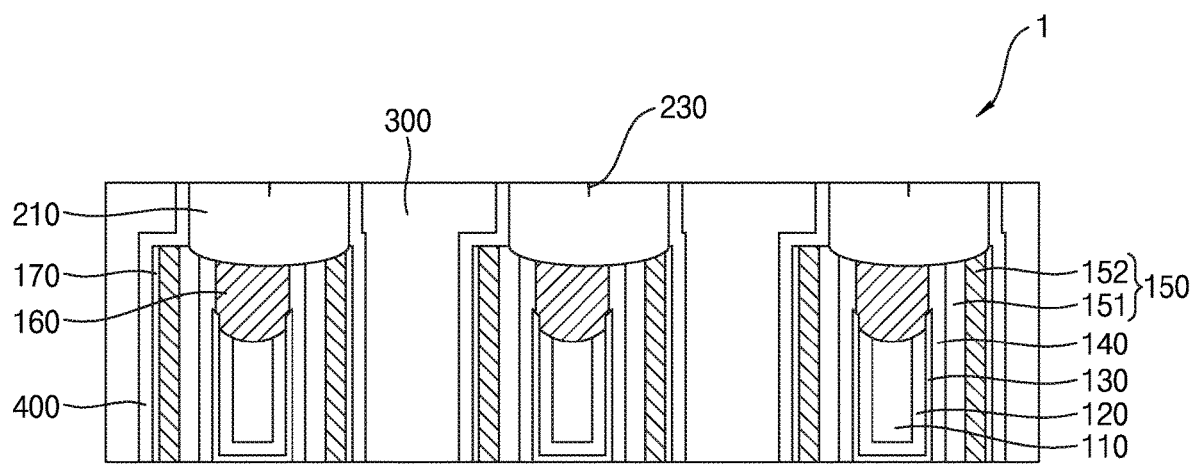

Referring to FIGS. 6 and 7, the inter-contact insulation pattern 210 and a center of the gate capping layer 160 may be misaligned. Referring to FIGS. 8 and 9, when a degree of misalign is excessive, an edge of a cross-sectional surface of the inter-contact insulation pattern 210 may contact an edge of a top surface of the second spacer 150 or an edge of a top surface of the interlayer insulation layer 170, at a top level of the gate capping layer 160. A side surface of the inter-contact insulation pattern 210 and a side surface of the second spacer 150 may be aligned to be almost or substantially vertical. In some embodiments, the side surface of the inter-contact insulation pattern 210 may pass through the side surface of the second spacer 150 and may be aligned vertically with the contact plug 300. For example, a portion of the inter-contact insulation pattern 210 may not vertically overlap the second spacer 150. A position of the inter-contact insulation pattern 210 and relative levels of the lowermost surface 210*l* of the inter-contact insulation pattern 210 and a top surface of each of the gate capping layer 160, the first spacer 140, and the second spacer 150 may be changed based on a degree of misalign.

Referring to FIGS. 3A, 3B, and 4 to 9, the semiconductor device 1 may further include a barrier 400 which surrounds the inter-contact insulation pattern 210, the gate structures 110, 120, 130, 140, 150, and 160, and the interlayer insulation layer 170. For example, the barrier 400 may include a barrier metal such as titanium nitride (TiN).

Figure 10:
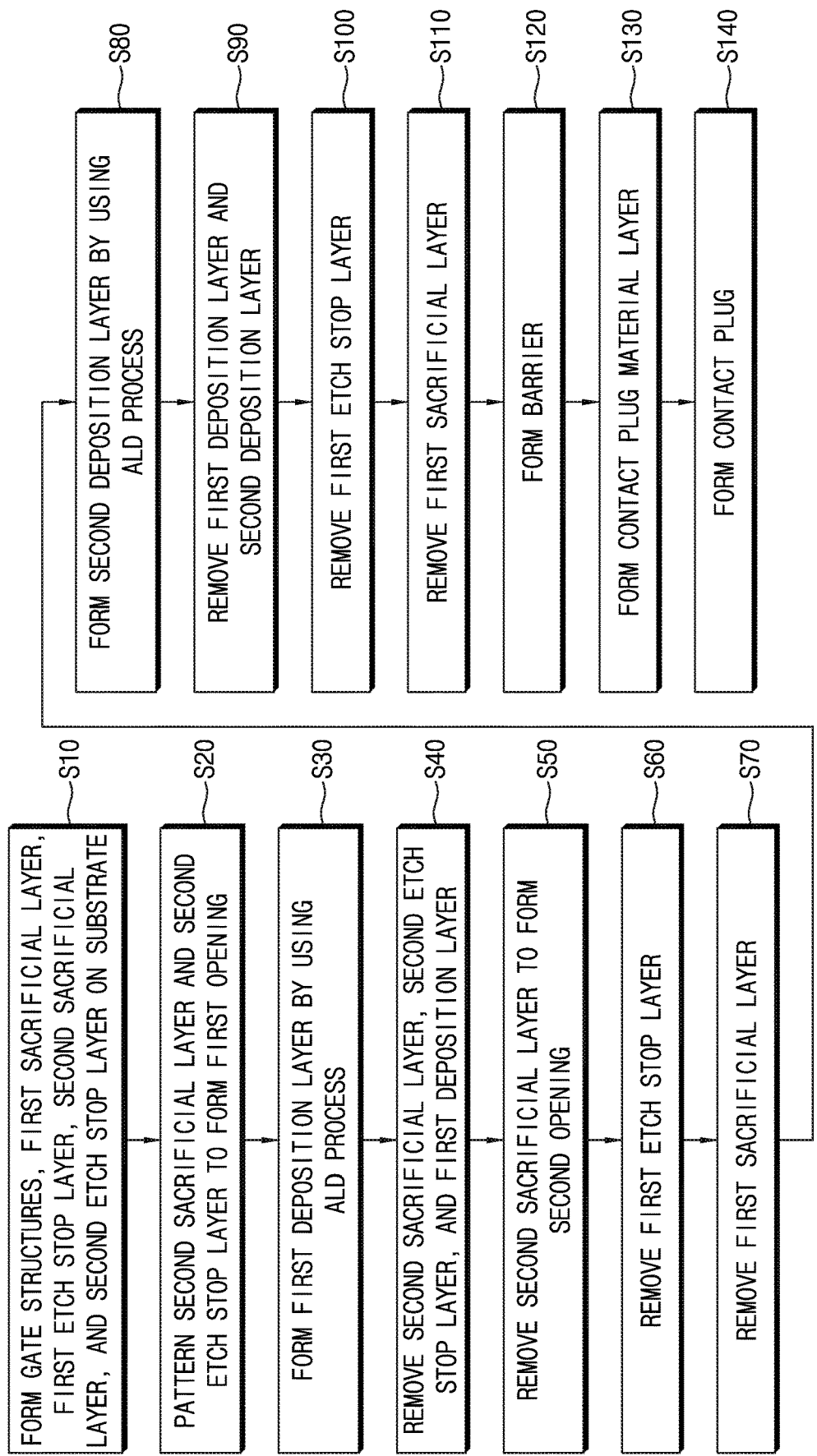
FIG. 10 is a flowchart of a method of manufacturing a semiconductor device according to some embodiments of the disclosure.

FIG. 10 is a flowchart describing a method of manufacturing a semiconductor device according to some embodiments of the disclosure, and FIGS. 11 to 22 are diagrams for describing the method of manufacturing a semiconductor device according to some embodiments of the disclosure.

Figure 11:
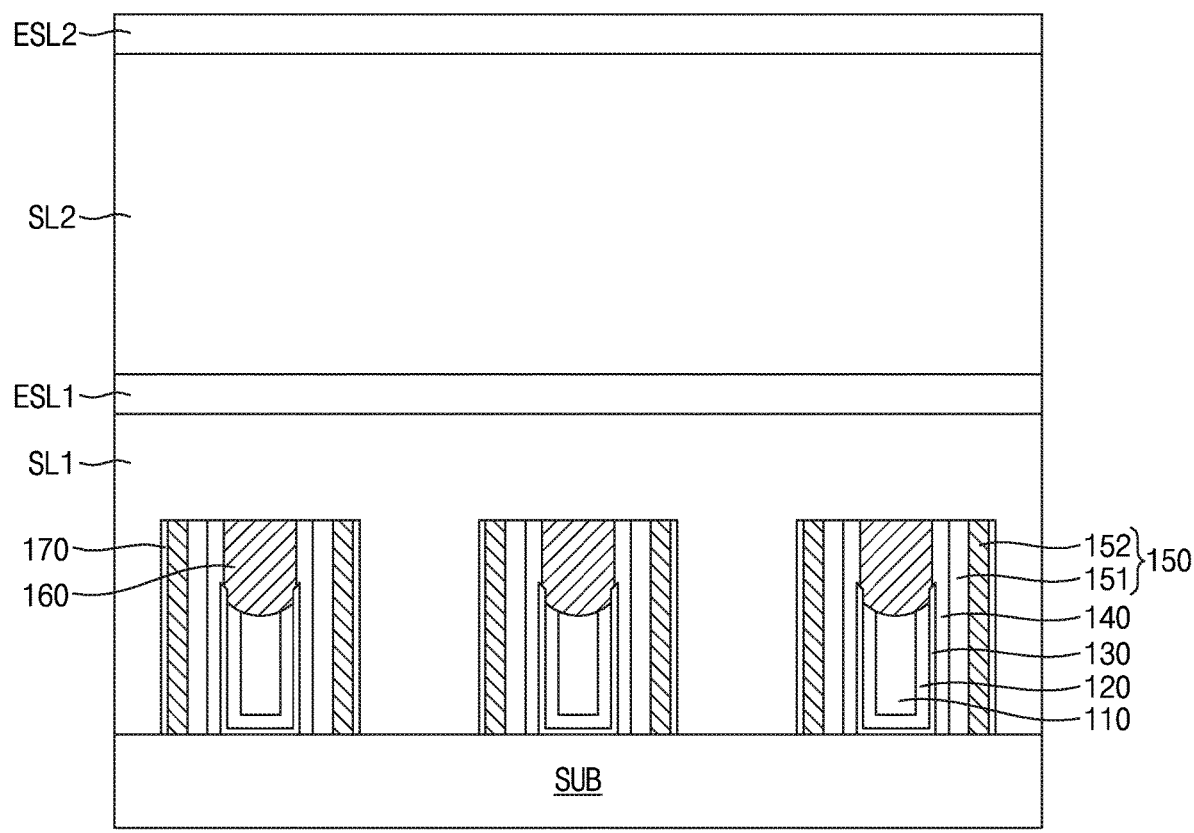
FIGS. 11 to 22 are diagrams of a method of manufacturing a semiconductor device according to some embodiments of the disclosure.

Referring to FIGS. 10 and 11, the method of manufacturing a semiconductor device according to some embodiments of the disclosure may include a process S10 of forming a plurality of gate structures 100 including a first gate metal 110, a second gate metal 120, a gate insulation layer 130, a first spacer 140, a second spacer 150, and a gate capping layer 160, a first sacrificial layer SL1, a first etch stop layer ESL1, a second sacrificial layer SL2, and a second etch stop layer ESL2, on a substrate SUB.

The first sacrificial layer SL1 and the second sacrificial layer SL2 may include a carbon-containing material such as spin-on hardmask (SOH). The first sacrificial layer SL1 may include a carbon-rich material which is high in content of carbon. The first etch stop layer ESL1 and the second etch stop layer ESL2 may include silicon nitride, silicon oxide, and/or silicon oxynitride (SiON).

Figure 12:
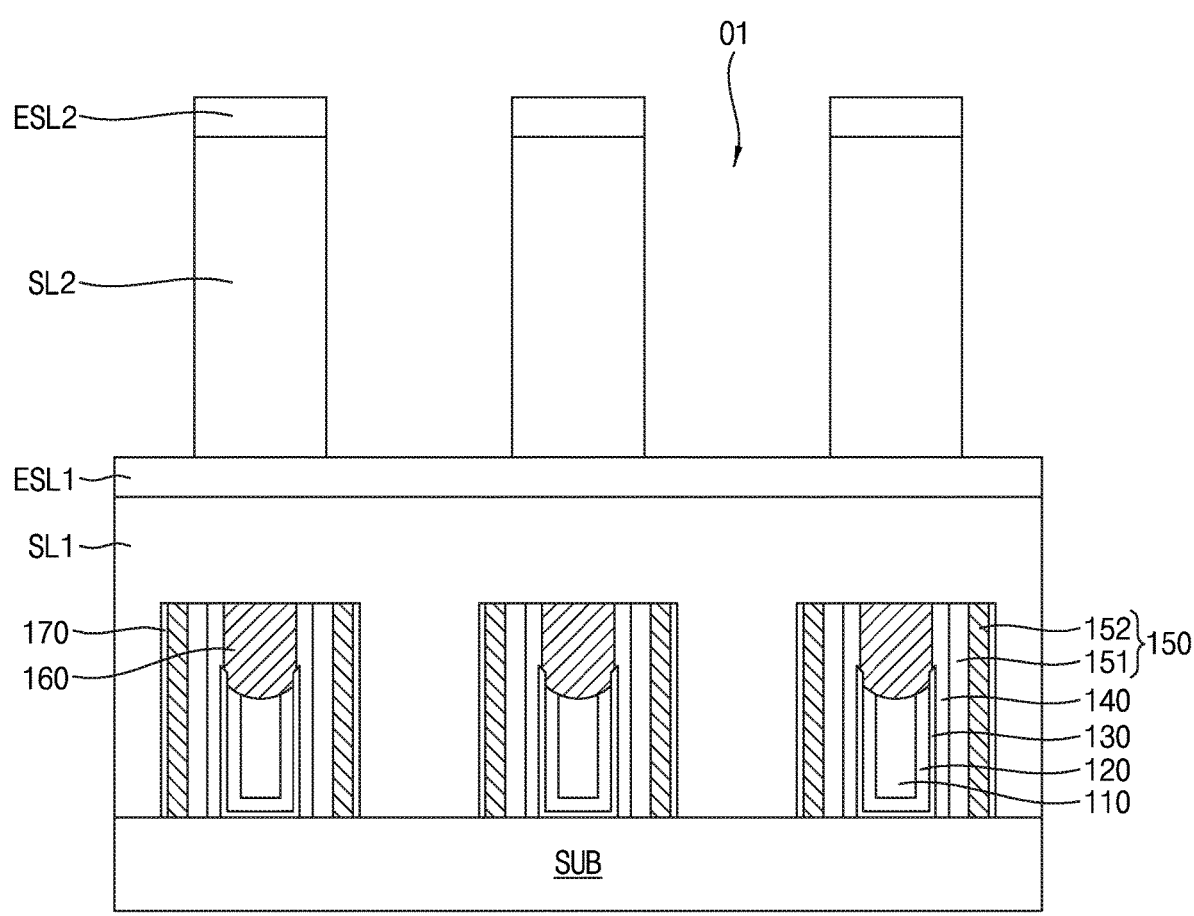

Referring to FIGS. 10 and 12, the method may include a process S20 of patterning the second etch stop layer ESL2 and the second sacrificial layer SL2 through a photolithography process and an etching process to form a plurality of first openings O1 partially exposing a top surface of the first etch stop layer ESL1. The first openings O1 may be aligned with a gap between the gate structures 100. A process of mask-opening the second sacrificial layer SL2 and the second etch stop layer ESL2 to form the first opening O1 may include a process of etching the second sacrificial layer SL2 and the second etch stop layer ESL2 so that the first opening O1 is substantially vertically formed (i.e. perpendicular to a top surface of the substrate SUB) by using plasma including nitrogen ($N_2$) and/or hydrogen ($H_2$). In a case which uses oxygen ($O_2$) plasma, an undercut may occur in the second sacrificial layer SL2, and thus, the first opening O1 may not vertically be formed.

Figure 13:
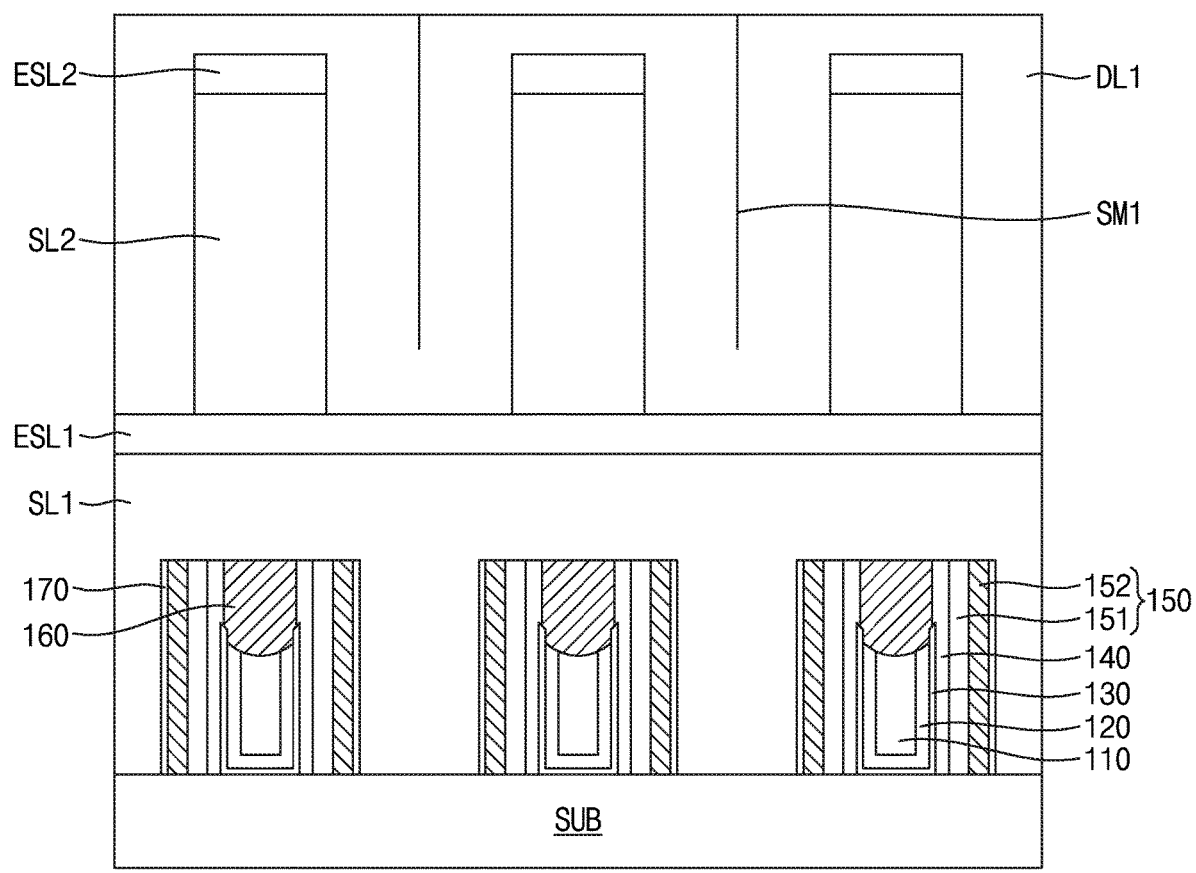

Referring to FIGS. 10 and 13, the method may include a process S30 of forming a first deposition layer DL1 conformally filling an inner portion of each of the first openings O1 through a deposition process such as an ALD process. For example, the first deposition layer DL1 may include silicon oxide, silicon nitride, and/or polysilicon. Referring to FIG. 12, the first deposition layer DL1 may include a first deposition layer seam SM1 at a center portion of a position at which the first opening O1 was disposed. The first deposition layer seam SM1 may be provided in plurality, and the plurality of first deposition layer seams SM1 may be provided at all or some of positions at which the first openings O1 were disposed.

Figure 14:
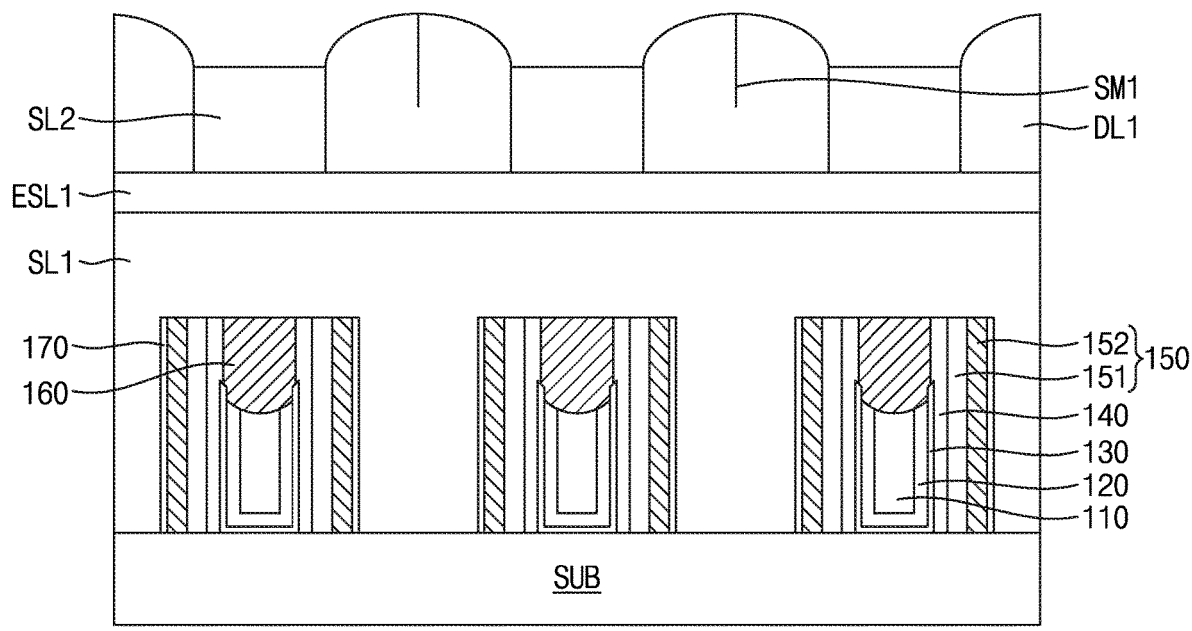

Referring to FIGS. 10 and 14, the method may include a process S40 of removing a portion of the second sacrificial layer SL2, the second etch stop layer ESL2, and a portion of the first deposition layer DL1 through an etch-back process.

A top surface of the second sacrificial layer SL2 may be recessed to be lower than a top surface of the first deposition layer DL1. A top surface of the first deposition layer DL2 may be rounded. Relative levels of the top surface of the second sacrificial layer SL2 and the top surface of the first deposition layer DL1 and a shape of the top surface of the first deposition layer DL1 may be changed based on a ratio of a chemical material used for the etch-back process. The first deposition layer DL1 may include a first deposition layer seam SM1. That is, a lower portion of the first deposition layer seam SM1 may remain even after the etch-back process. In some embodiments, when the etch-back process is sufficiently performed or when the first deposition layer seam SM1 is not formed in the first deposition layer DL1, the first deposition layer seam SM1 may not be formed.

Figure 15:
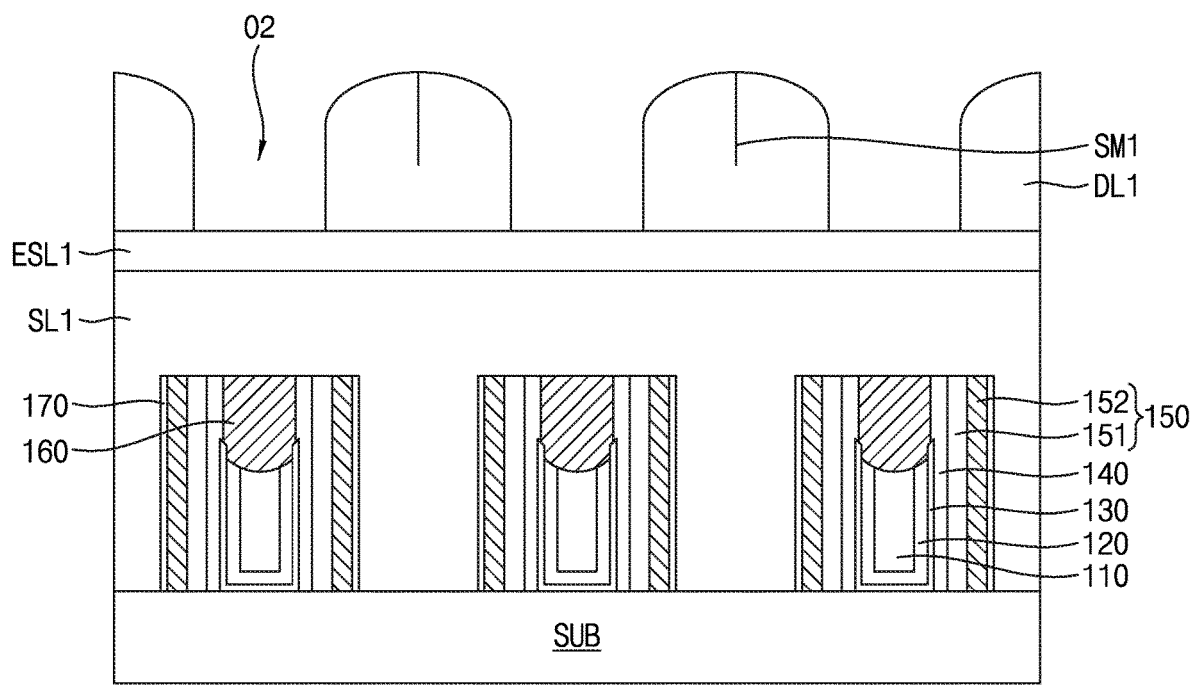

Referring to FIGS. 10 and 15, the method may include a process S50 of removing the second sacrificial layer SL2 to form a second opening O2. A surface of the first etch stop layer ESL1 may be exposed at a position of the second opening O2. The second opening O2 may be aligned substantially vertically with the gate structure 100. The process S50 of removing the second sacrificial layer SL2 may include a process of performing an ashing process by using an oxygen ($O_2$) gas.

Figure 16:
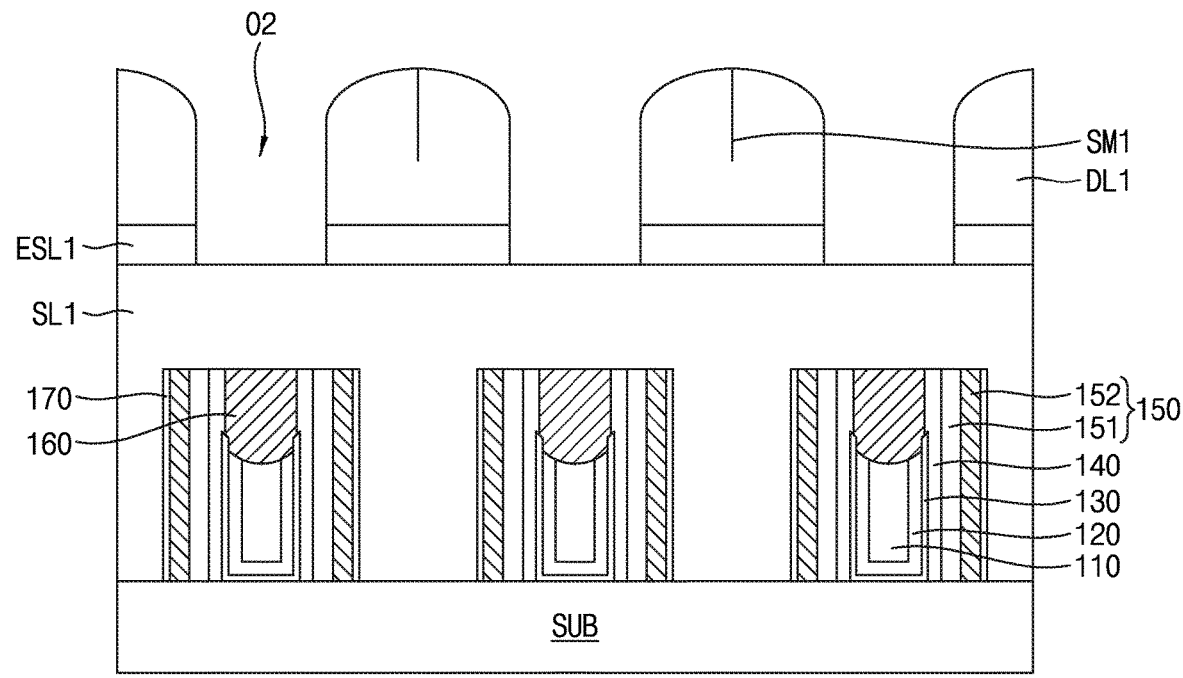
Figure 17:
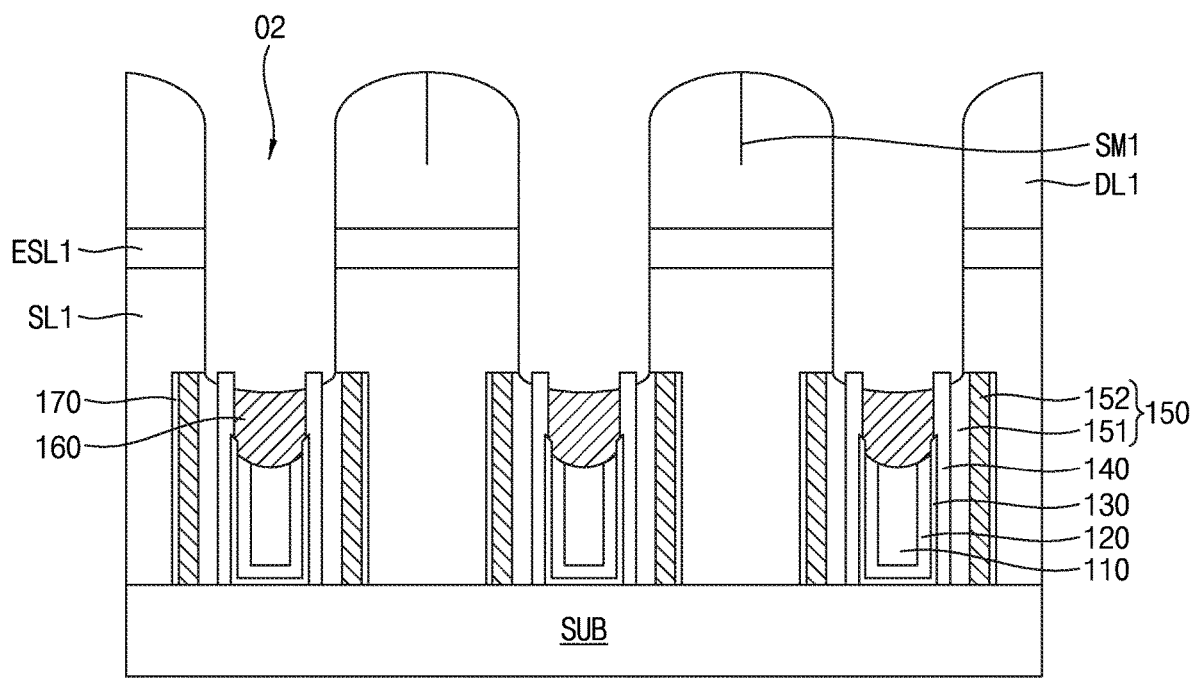

A process of removing a portion of the first etch stop layer ESL1 and a portion of the first sacrificial layer SL1 may include a single etching process, but referring to FIGS. 16 and 17, the process of removing a portion of the first etch stop layer ESL1 and then removing a portion of the first sacrificial layer SL1 may include a process of performing a two-step etching process.

Referring to FIGS. 10 and 16, the method may include a process S60 of removing the first etch stop layer ESL1 exposed at an inner portion of the second opening O2 through an etching process. The first sacrificial layer SL1 may be exposed at the inner portion of the second opening O2. An etchant used to remove the first etch stop layer ESL1 may include phosphoric acid ($H_3PO_4$).

Referring to FIGS. 10 and 17, the method may include a process S70 of removing the first sacrificial layer SL1 exposed at the inner portion of the second opening O2 through an etching process. The gate structure 100 may be exposed at the inner portion of the second opening O2. At this time, a gate oxide layer may be formed on at least one of the gate capping layer 160, the first spacer 140, and/or the second spacer 150. The gate oxide layer may include an oxidized silicon nitride layer.

Referring to FIG. 17, whether to recess top surfaces of the gate capping layer 160, the first spacer 140, and/or the second spacer 150, and a recessed degree of the top surfaces may be determined respectively based on materials thereof. For example, when the gate capping layer 160 and the second spacer 150 include SiN and the first spacer 140 includes SiON, an upper portion of each of the gate capping layer 160 and the second spacer 150 may be recessed to be lower than an upper portion of the first spacer 140.

Figure 18:
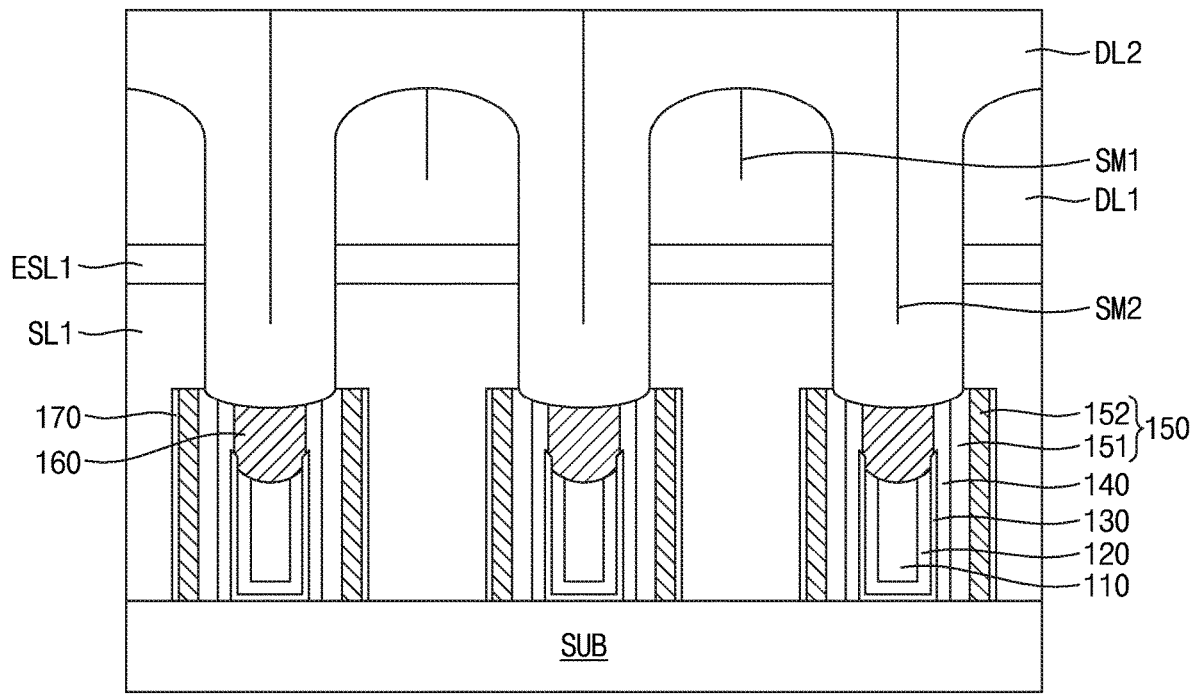

Referring to FIGS. 10 and 18, the method may include a process S80 of forming the second deposition layer DL2 in a plurality of second openings O2 through an ALD process. The second deposition layer DL2 may include silicon oxide ($SiO_2$). The second deposition layer DL2 may include a second deposition layer seam SM2 at a center portion of a position of the second opening O2. A plurality of second deposition layer seams SM2 may be provided at all or some of positions at which the second openings O2 occurred.

Referring to FIGS. 17 and 18, even in a case where upper portions of the gate capping layer 160, the first spacer 140, and/or the second spacer 150 are recessed to different degrees, when the second deposition layer DL2 including silicon oxide is formed, the upper portions of the gate capping layer 160, the first spacer 140, and the second spacer 150 may be fused to the second deposition layer DL2. Accordingly, after the second deposition layer DL2 is formed, the recessed upper portions of the gate capping layer 160, the first spacer 140, and the second spacer 150 may be flat.

Figure 19:
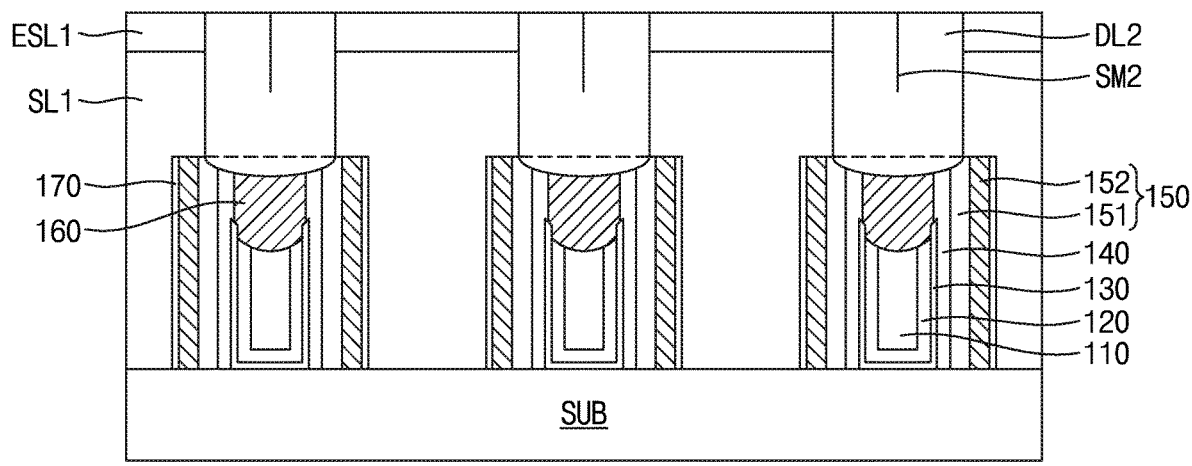

Referring to FIG. 19, the method may include a process S90 of removing a portion of the second deposition layer DL2 and/or a portion or all of the first deposition layer DL1. The process S90 of removing a portion of the second deposition layer DL2 and/or the first deposition layer DL1 may include a process of performing a wet-etching process using hydrofluoric acid (HF). In some embodiments, the process S90 of removing a portion of the second deposition layer DL2 and/or the first deposition layer DL1 may include a process of performing a dry-etching process such as an etch-back process. In some embodiments, the process S90 of removing a portion of the second deposition layer DL2 and the first deposition layer DL1 may include a process of performing a planarization process such as a CMP process.

Figure 20:
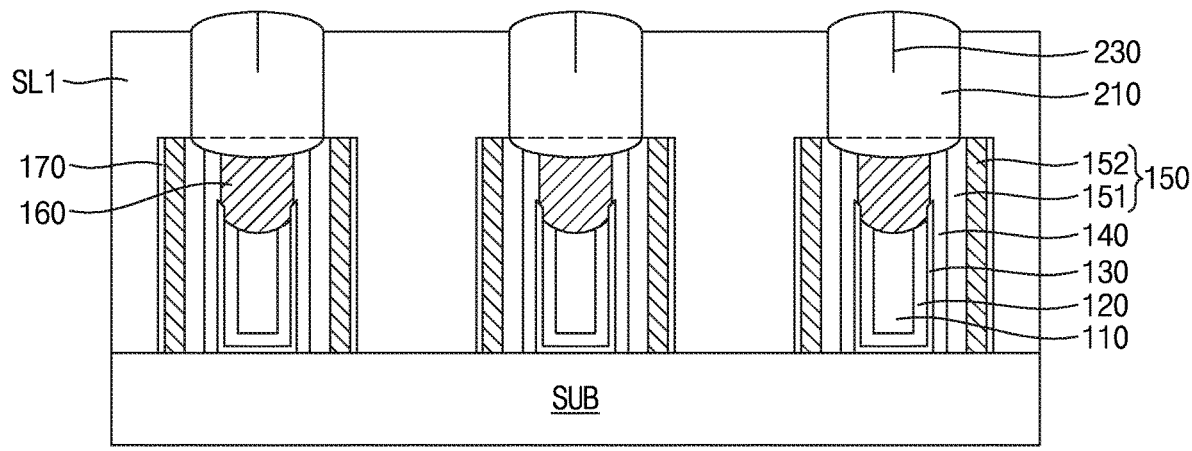

Referring to FIG. 20, the method may include a process S100 of removing the first etch stop layer ESL1. The process S100 of removing the first etch stop layer ESL1 may include a process of performing a dry-etching process such as an etch-back process. In such a process, a portion of the second deposition layer DL1 may be removed. For example, corners of the second deposition layer DL2 may be partially removed, and thus, a top surface of the second deposition layer DL2 may be round. In some embodiments, another portion of the second deposition layer DL2 may not be removed, and only the first etch stop layer ESL1 may be removed.

A top surface of the first sacrificial layer SL1 may be recessed to be lower than the remaining top surface of the second deposition layer DL2. Relative levels of the top surface of the first sacrificial layer SL1 and the top surface of the remaining second deposition layer DL2 and a shape of the top surface of the remaining second deposition layer DL2 may be changed based on a ratio of a chemical material used for a removal process.

The remaining second deposition layer DL2 may form the inter-contact insulation pattern 210. The second deposition layer seam SM2 remaining after the removal process may be the seam 230 and may be included in the inter-contact insulation pattern 210. In some embodiments, when the removal process is excessively performed or when the second deposition layer seam SM2 is not formed in the second deposition layer DL2, the seam 230 may not be provided.

Figure 21:
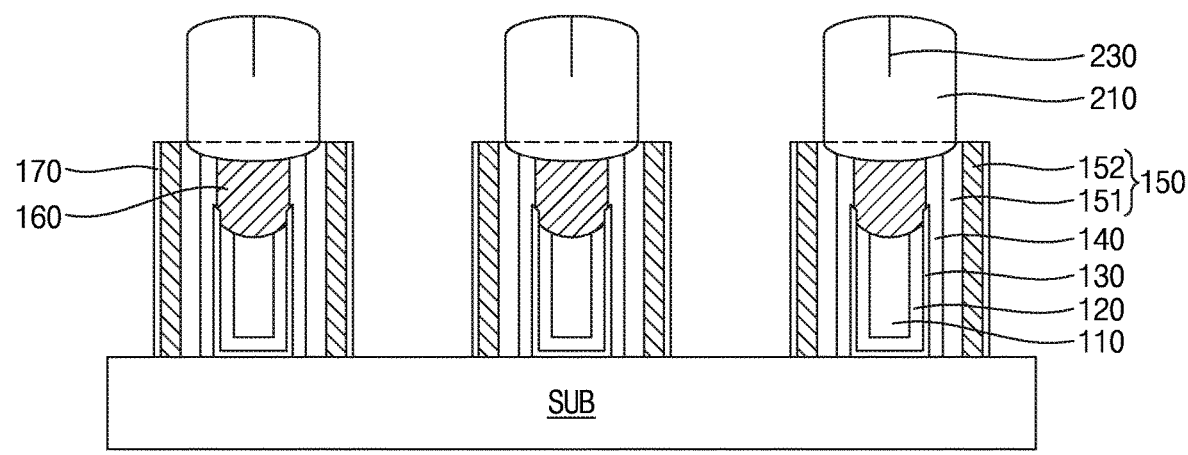

Referring to FIGS. 10 and 21, the method may include a process S110 of removing the first sacrificial layer SL1. The first sacrificial layer SL1 may be removed, and thus, the substrate SUB may be exposed between the interlayer insulation layers 170 disposed on side surfaces of the gate structures 100. The process S110 of removing the first sacrificial layer SL1 may include a process of ashing the first sacrificial layer SL1 including SOH by using an oxygen ($O_2$) gas. In order to fully remove the first sacrificial layer SL1, an ashing process may be sufficiently performed. In the ashing process, the first spacer 140, the second spacer 150 and the gate capping layer 160 may each include silicon nitride, and the inter-contact insulation pattern 210 and the interlayer insulation layer 170, each including oxide, may be hardly removed, and thus it may be possible to remove the first sacrificial layer SL1 including a carbon-rich material. Accordingly, a high selectivity process may be performed. Also, the semiconductor device manufactured by the method of manufacturing the semiconductor device according to some embodiments of the disclosure may secure a bottom open margin of a source/drain contact hole and may prevent the collapse of a shoulder of silicon nitride of the gate structure 100 (e.g., the shoulder of gate capping layer 160.

Figure 22:
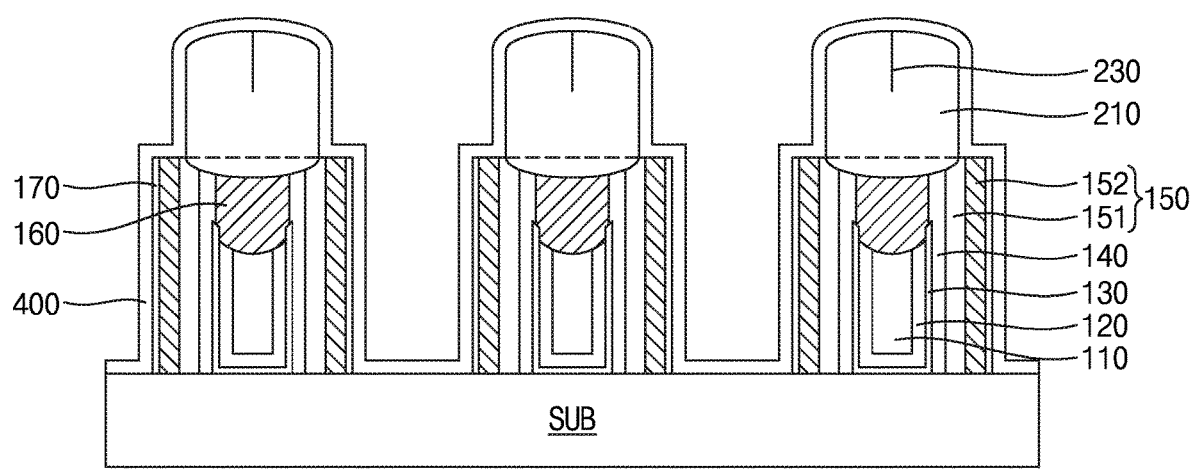

Referring to FIGS. 10 and 22, the method may include a process S120 of forming the barrier 400 covering the inter-contact insulation pattern 210, the gate structure 100, and/or the interlayer insulation layer 170. For example, the barrier 400 may include a barrier metal such as TiN.

Subsequently, referring to FIGS. 3A and 3B, the method may include forming a contact plug material layer S130 and a process S140 of covering the barrier 400 with a contact plug material layer and removing the contact plug material layer and an upper portion of the inter-contact insulation pattern 210 through a CMP process to form the contact plug 300. A lowermost surface of the contact plug 300 may contact the source/drain 500. A silicide layer SCL may be disposed between a bottom surface of the contact plug 300 and the source/drain 500.

The semiconductor device 1 and the method of manufacturing the same, according to some embodiments of the disclosure, may be applied to a fin field effect transistor (FinFET), a vertical field effect transistor (VFET), a gate all around (GAA), MBCFET, etc.

According to some embodiments of the disclosure, a method of manufacturing a semiconductor device may include a process of forming a double sacrificial layer including a carbon-containing material such as spin-on hardmask (SOH). Therefore, the method of manufacturing a semiconductor device according to some embodiments of the disclosure may perform a high selectivity process. Also, a semiconductor device manufactured by the method of manufacturing a semiconductor device according to some embodiments of the disclosure may secure a bottom open margin of a source/drain contact plug and may prevent the collapse of a shoulder of silicon nitride of a gate capping layer.

Moreover, according to some embodiments of the disclosure, a semiconductor device may be manufactured by performing a process including a process of forming a double sacrificial layer. The semiconductor device including a self-aligned contact includes a gate structure with a concavely recessed top surface and an inter-contact insulation pattern including a lowermost surface disposed at a level which is lower than an uppermost surface of the gate structure.

Hereinabove, the embodiments of the disclosure have been described with reference to the accompanying drawings, but it may be understood that those skilled in the art may implement the embodiments in another detailed form without changing the inventive concept or the essential feature. It should be understood that the embodiments described above are merely examples in all aspects and are not limited.

What is claimed is:
1. A semiconductor device comprising:
a fin type active pattern extending in a first direction;
a plurality of gate structures on the fin type active pattern and extending in a second direction different from the first direction;

a plurality of inter-contact insulation patterns on respective ones of the plurality of gate structures;
a plurality of interlayer insulation layers on side surfaces of the plurality of gate structures; and
a plurality of contact plugs respectively between pairs of the plurality of gate structures,
wherein the fin type active pattern comprises a plurality of source/drains,
wherein lower ends of the plurality of contact plugs contact respective ones of the plurality of source/drains,
wherein the plurality of gate structures each comprises:
a first gate metal;
a second gate metal on a side surface and a lower portion of the first gate metal;
a gate capping layer on the first gate metal and the second gate metal, wherein the gate capping layer comprises a side surface which is inclined so that an area of a horizontal cross-sectional surface thereof increases toward an upper portion thereof in a direction away from the fin type active pattern;
a gate insulation layer on a side surface and a lower portion of the second gate metal and a lower portion of a side surface of the gate capping layer;
a first spacer on a side surface of the gate insulation layer and a side surface of the gate capping layer; and
a second spacer on a side surface of the first spacer,
wherein an uppermost surface of the gate capping layer, an uppermost surface of the first spacer, and an uppermost surface of the second spacer are at a level which is higher than a lowermost surface of each of the plurality of inter-contact insulation patterns, with respect to the fin type active pattern,
wherein a top surface of the gate capping layer is concavely recessed, and
wherein a top surface of the first spacer is downward recessed towards the fin type active pattern.

2. The semiconductor device of claim 1, wherein the second spacer comprises an internal second spacer and an external second spacer.

3. The semiconductor device of claim 1, wherein the fin type active pattern further comprises a silicide layer between ones of the plurality of contact plugs and between ones of the plurality of source/drains.

4. A semiconductor device comprising:
a fin type active pattern that extends in a first direction;
a plurality of gate structures on the fin type active pattern and extending in a second direction different from the first direction;
a plurality of inter-contact insulation patterns on respective ones of the plurality of gate structures;
a plurality of interlayer insulation layers on side surfaces of the plurality of gate structures; and
a plurality of contact plugs respectively between pairs of the plurality of gate structures,
wherein the fin type active pattern comprises a plurality of source/drains,
wherein lower ends of the plurality of contact plugs contact respective ones of the plurality of source/drains,
wherein the plurality of gate structures each comprises:
a first gate metal;
a second gate metal on a side surface and a lower portion of the first gate metal;
a gate capping layer on the first gate metal and the second gate metal;
a gate insulation layer on a side surface and a lower portion of the second gate metal and a lower portion of a side surface of the gate capping layer;
a first spacer on a side surface of the gate insulation layer and the gate capping layer; and
a second spacer on a side surface of the first spacer,
wherein an uppermost surface of the gate capping layer, an uppermost surface of the first spacer, and an uppermost surface of the second spacer are at a level which is higher than a lowermost surface of each of the plurality of inter-contact insulation patterns, with respect to the fin type active pattern,
wherein a top surface of the gate capping layer is concavely recessed, and
wherein a top surface of the first spacer is downward recessed towards the fin type active pattern.

5. The semiconductor device of claim 4, wherein the second spacer comprises an internal second spacer and an external second spacer.

6. The semiconductor device of claim 5, wherein a top surface of the internal second spacer is downward recessed towards the fin type active pattern.

7. The semiconductor device of claim 6, wherein a top surface of the external second spacer is downward recessed towards the fin type active pattern.

8. The semiconductor device of claim 4, wherein the fin type active pattern further comprises a silicide layer between ones of the plurality of contact plugs and between ones of the plurality of source/drains.

9. The semiconductor device of claim 4, wherein at least one of the plurality of inter-contact insulation patterns comprises a seam.

10. The semiconductor device of claim 9, wherein two or more of the plurality of inter-contact insulation patterns each comprise a respective seam such that there is a plurality of respective seams, and at least one of the plurality of respective seams is formed vertically along a center axis of a respective one of the plurality of inter-contact insulation patterns.

11. The semiconductor device of claim 4, wherein top surfaces of the plurality of inter-contact insulation patterns and the plurality of contact plugs are coplanar.

12. The semiconductor device of claim 4, wherein each of the plurality of inter-contact insulation patterns and a center of the gate capping layer are substantially vertically aligned.

13. The semiconductor device of claim 4, wherein a bottom surface of each of the plurality of inter-contact insulation patterns protrudes downward toward the first and second gate metals.

14. The semiconductor device of claim 4, wherein each of the plurality of inter-contact insulation patterns comprises an upper portion comprising deposited silicon oxide and a lower portion comprising oxidized silicon nitride.

15. A semiconductor device comprising:
a fin type active pattern extending in a first direction;
a plurality of gate structures extending on the fin type active pattern and in a second direction different from the first direction;
a plurality of inter-contact insulation patterns on respective ones of the plurality of gate structures;
a plurality of interlayer insulation layers on side surfaces of the plurality of gate structures; and
a plurality of contact plugs between pairs of the plurality of gate structures,
wherein the fin type active pattern comprises a plurality of source/drains, wherein lower ends of the plurality of contact plugs contact respective ones of the plurality of source/drains, wherein the plurality of gate structures each comprises:

a first gate metal;

a second gate metal on a side surface and a lower portion of the first gate metal;

a gate capping layer on the first gate metal and the second gate metal;

a gate insulation layer on a side surface and a lower portion of the second gate metal and a lower portion of a side surface of the gate capping layer;

a first spacer on a side surface of each of the gate insulation layer and the gate capping layer;

a second spacer on a side surface of the first spacer; and a plurality of gate layers sequentially stacked apart from one another on a lower portion of the gate insulation layer, wherein an uppermost surface of the gate capping layer, an uppermost surface of the first spacer, and an uppermost surface of the second spacer are at a level which is higher than a lowermost surface of each of the plurality of inter-contact insulation patterns with respect to the fin type active pattern, wherein a top surface of the gate capping layer is concavely recessed, and wherein a top surface of the first spacer is downward recessed towards the fin type active pattern.

16. The semiconductor device of claim 15, wherein the second spacer comprises an internal second spacer and an external second spacer, and wherein the interlayer insulation layers are spaced apart from the inter-contact insulation patterns.

17. The semiconductor device of claim 16, wherein a top surface of the internal second spacer is downward recessed towards the fin type active pattern.

18. The semiconductor device of claim 17, wherein a top surface of the external second spacer is downward recessed towards the fin type active pattern.

19. The semiconductor device of claim 15, wherein the fin type active pattern further comprises a silicide layer between ones of the plurality of contact plugs and between ones of the plurality of source/drains.

20. The semiconductor device of claim 15, wherein at least one of the plurality of inter-contact insulation patterns comprises a seam.

* * * * *